United States Patent [19]

Maekawa et al.

[11] Patent Number: 4,751,403
[45] Date of Patent: Jun. 14, 1988

[54] TRANSISTOR DRIVING CIRCUIT AND CIRCUIT CONTROLLING METHOD

[75] Inventors: Hitoshi Maekawa, Yokohama; Michitaka Ohsawa, Fujisawa; Kunio Ando, Yokohama, all of Japan

[73] Assignee: Hitachi, Ltd., Tokyo, Japan

[21] Appl. No.: 743,079

[22] Filed: Jun. 10, 1985

[30] Foreign Application Priority Data

Jun. 15, 1984 [JP] Japan ............................. 59-121746
Sep. 3, 1984 [JP] Japan ............................. 59-182616

[51] Int. Cl.⁴ ...................... G05F 1/40; H03K 3/33; H03K 17/60
[52] U.S. Cl. ................... 307/270; 307/254; 307/280; 307/300; 323/289
[58] Field of Search ............ 307/270, 280, 300, 254; 323/289

[56] References Cited

U.S. PATENT DOCUMENTS

| 4,055,794 | 10/1977 | Ickes et al. | 307/300 |
| 4,312,029 | 1/1982 | Zellmer | 307/300 |
| 4,318,011 | 3/1982 | Zeis | 307/359 |
| 4,410,810 | 10/1983 | Christen | 307/280 |
| 4,566,060 | 1/1986 | Hoeksma | 323/289 |

Primary Examiner—Stanley D. Miller
Assistant Examiner—B. P. Davis
Attorney, Agent, or Firm—Robert E. Bushnell

[57] ABSTRACT

A driving circuit uses an output transistor and a driving transformer with a secondary coil being connected to the base of the output transistor. In order to get a high speed switching circuit without thermal runaway, the storage period of the output transistor is detected. A signal supplied to a primary coil of the driving transformer, for example, a driving pulse, is controlled in response to the detected value of the storage period. By minimizing the value of the storage period, it becomes possible to minimize a fall time of the output transistor, so that a stability of the driving circuit can be maintained.

50 Claims, 8 Drawing Sheets

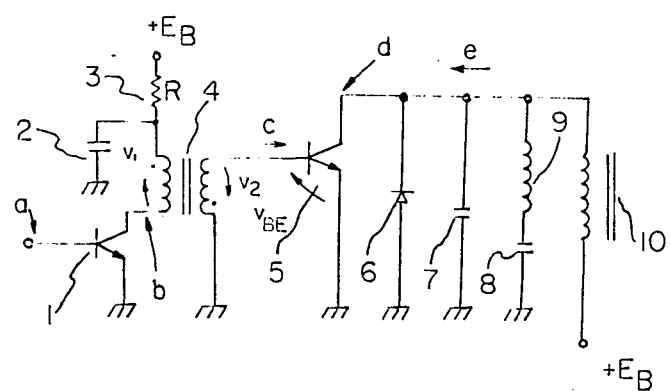
FIG.1
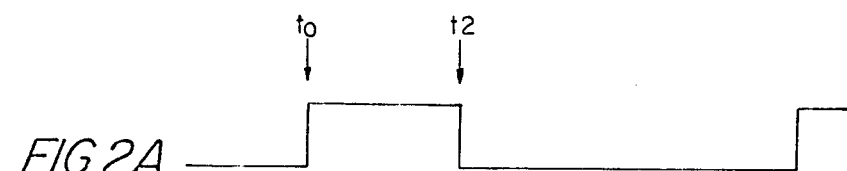
FIG.2A
FIG.2B
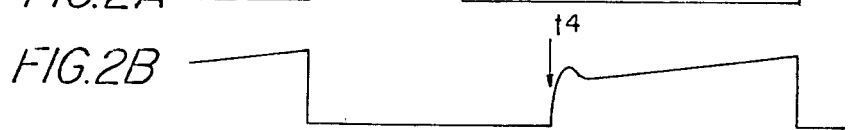
FIG.2C
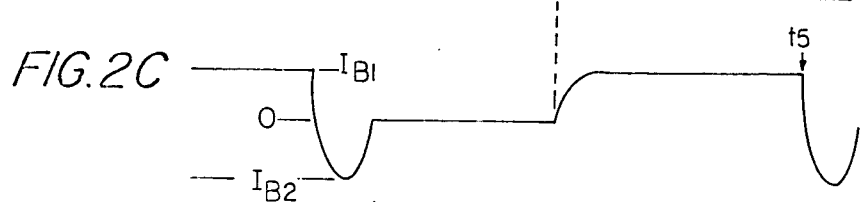
FIG.2D
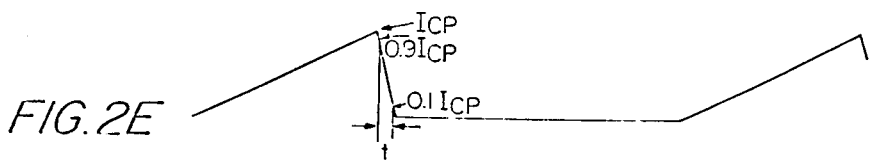
FIG.2E

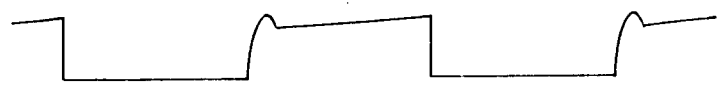
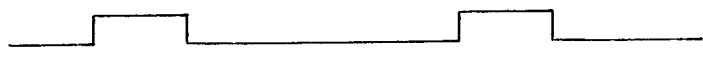
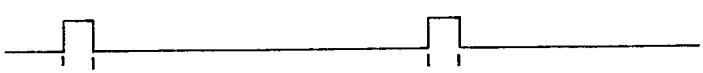
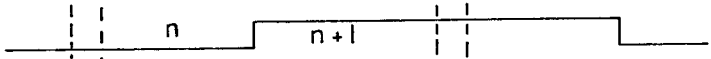
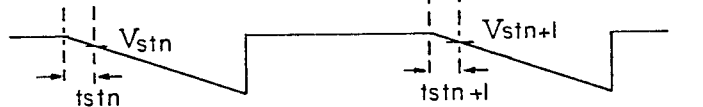
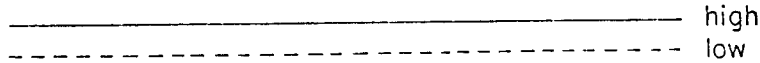
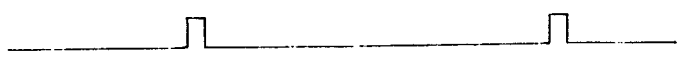

TRANSISTOR DRIVING CIRCUIT AND CIRCUIT CONTROLLING METHOD

BACKGROUND OF THE INVENTION

This invention relates to a transistor driving circuit, especially a transistor driving circuit for such application as a CRT display, a television receiver or a switching power supply, and a method for controlling the circuit.

In the prior art, transistor driving circuits have some problems with various characteristics: for example, it is not possible to adequately shorten their fall times, that is, the duration indicating their switching speeds. In substance, transistor driving circuits having a sufficiently high speed ability were not previously available for switching, especially transistor driving circuits for high definition CRT displays.

SUMMARY OF THE INVENTION

It is an object of the present invention to provide an improved transistor driving circuit.

It is also an object to provide a method for controlling a transistor driving circuit having an ability for high speed switching.

It is another object to provide a transistor driving circuit in which the variation in fall time of an output transistor due to a rise in temperature is reduced and the fall time is constantly held at a minimum, so that there is little possibility of a thermal In order to achieve the above objects, in the present invention, a storage period or a carrier storage time of an output transistor in a driving circuit is detected, and in response to an increase or a decrease in the storage period, one of the signals supplied to a primary coil of a transformer of a driving circuit is controlled in order to continuously hold the storage period at a minimum value. This may be achieved by either controlling the driving pulse by regulating a characteristic of the driving pulse, especially the pulse width, or by controlling the driving supply voltage used.

The present invention is based on a discovery by the present inventors that there is a point at which both the storage period and the decreasing duration become minimum values as the driving pulse width or the driving supply voltage supplied to the primary coil are varied.

Therefore, it is possible to hold the fall time at the minimum value by detecting the storage period $t_{stg}$ and controlling one of the signals supplied to the primary coil to keep the storage period $t_{stg}$ at the minimum value $t_{sm}$. As a result, in this invention, it becomes possible to suppress the generation of energy losses during the fall time and prevent thermal runaway.

BRIEF DESCRIPTION OF THE DRAWINGS

FIG. 1 shows a circuit diagram of a transistor driving circuit in the prior art;

FIGS. 2a to 2e illustrate waveforms of voltages or currents at indications a to e in FIG. 1;

FIGS. 9A to 9L illustrate waveforms of voltages or currents at indications A to L in FIG. 5;

DETAILED DESCRIPTION

Figure 3A:
FIGS. 3a to 3t illustrate waveforms of voltages or currents for explaining a method of solving one of the problems in the circuit shown in FIG. 1.
Figure 3B:
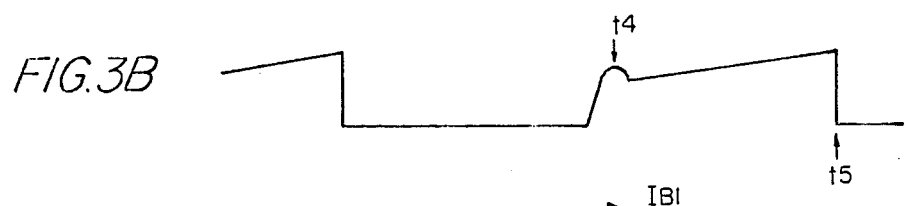

An example of the transistor driving circuit in the prior art is explained by using FIGS. 1 and 2, hereinafter. FIG. 1 shows a circuit diagram of a circuit for driving a horizontal deflection output circuit in an appliance such as a television receiver or a display. FIGS. 2a to 2e illustrate waveforms of voltages or currents at indications a to e in FIG. 1.

FIGS. 2a and 2b depict a voltage waveform of a horizontal oscillating pulse supplied to a base of a driving transistor 1 and a voltage waveform of a collector of the driving transistor 1, respectively. FIGS. 2c, 2d and 2e show waveforms of a current flowing in a base of an output transistor 5, a collector voltage and a collector current $I_c$ of the transistor 5, respectively. In FIGS. 2c and 2e, the currents flowing in the directions shown in FIG. 1 are positive. Referring to FIG. 1, the driving transistor 1 and the output transistor 5 act as switches. The output transistor 5 is driven to an OFF state at a time $t_o$, so that remaining carriers which accumulated in a base region start to recombine and the collector current $I_c$ shown in FIG. 2e starts to decrease at a time $t_1$. In a transition duration from the time $t_1$ to a time in which the collector current $I_c$ becomes zero, the collector voltage rises as shown in FIG. 2d and a large energy loss is generated.

Now, assuming that $I_{cp}$ indicates the maximum collector current during an ON state of the output transistor 5, a decreasing duration or fall time $t_f$, that is, a duration from a time in which the collector current is 0.9 $I_{cp}$ to a time in which the collector current becomes 0.1 $I_{cp}$, is used for indicating a switching speed. Under a charge control model, the fall time $t_f$ is expressed by the following formula, $$t_f = \frac{0.9(V_{CB} - C_{ob} + I_{cp}/wt)}{I_{cp}/2h_{FE} - I_{B2}} \quad (1)$$

where $V_{CB}$ is a variation of the base voltage, $C_{ob}$ is a collector junction capacity, $h_{FE}$ is a current gain in a large amplitude operation and $I_{B2}$ is a maximum value of a reverse base current. As apparent from formula (1), the decreasing duration $t_f$ becomes smaller when the absolute value of $I_{B2}$ becomes larger. Further, a forward base current $I_{B1}$ is proportional to the product $I_{cp} \times h_{FE}$. When setting a large current ratio $I_{B2}/I_{B1}$ of the driving circuit, a polarity of a transformer 4 is selected so that the output transistor 5 switches to the OFF state during the ON state of the driving transistor 1. That is, it is possible for a large current to flow from a condenser 2, as an energy storage means just after the driving transistor 1 switches to the ON state at $t_o$. The condenser 2 is connectable to either terminal of a primary coil of the transformer 4. Further, at the secondary side of the transformer 4, a base-emitter voltage $V_{BE}$ of the output transistor 5 has a reverse polarity to the electromotive force of the transformer 4 during the ON state of the output transistor 5. In contrast, the base-emitter voltage $V_{BE}$ due to a carrier storage effect has the same polarity to the electromotive force of the transformer 4 during the OFF state of the output transistor 5. Accordingly, a peak value of the reverse base current $I_{B2}$ shown in FIG. 2C becomes larger than a peak value of the forward base current $I_{B1}$. In general, it is possible to set the current ratio $I_{B2}/I_{B1}$ at about 1.2 to 1.4. However, it is not possible to shorten the fall time $t_f$ adequately.

On the other hand, a horizontal deflection frequency $f_H$ in prior art circuits has become higher in response to development of displays having higher definition. Since the loss during the fall time of the collector current of the output transistor 5 is in proportion to the cube of the frequency $f_H$, the loss increases sharply in response to the rise of the frequency $f_H$. This is a first problem recognized by the present inventors. Further, even if the frequency $f_H$ is set so that the loss is acceptable in a normal temperature operation, there is a possibility that a thermal runaway will occur, that is, the temperature rises due to some reason, the fall time increases, the loss increases and finally the transistor 5 breaks down. This is a second problem recognized by the present inventors.

The present inventors have suggested some changes of circuit parameters so that the magnetic flux density of the transformer 4 could be set to not saturate during a charge period of the output transistor 5, and to saturate during a charge period of the transformer 4, and the magnetic flux density, of the transformer 4 is kept at nearly a residual magnetic flux density, when the output transistor 5 is driven to the OFF state.

Figure 3C:
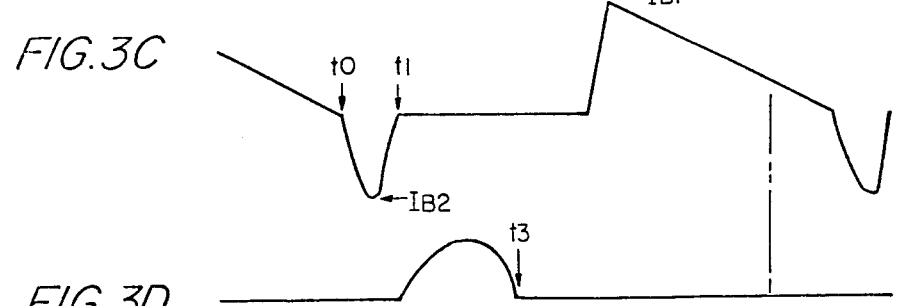
Figure 3D:
Figure 3E:
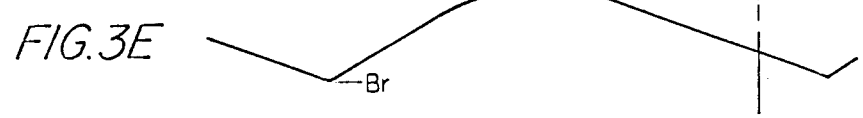
Figure 3F:

FIGS. 3a to 3f illustrate waveforms of voltages or currents at indications a to e in FIG. 1, with transformer 4 designed for the above condition. FIGS. 3a, 3b, 3c, 3d and 3f correspond to FIGS. 2a, 2b, 2c, 2d and 2e respectively. FIG. 3e shows a variation of the magnetic flux density of the transformer 4. Referring to FIG. 3e, $B_m$ denotes a saturated magnetic flux density and $B_r$ designates the residual magnetic flux density. When the transistor 1 switches to the ON state, the current flows through the primary coil of the transformer 4 and the magnetic energy is stored in the transformer 4. Therefore, the magnetic flux density of the transformer 4 rises in proportion to the time, and reaches the saturated magnetic flux density $B_m$ at a time $t_4$, at which the transistor 1 turns off. After the time $t_4$, the magnetic energy accumulated in the transformer 4 is spent as the forward base current of the transistor 5 shown in FIG. 3C. At a time $t_5$, when the transistor 1 turns on again, the magnetic flux density of the transformer 4 has decreased to the residual magnetic flux level $B_r$. Here, the base current of the output transistor 5 decreases linearly from the time $t_4$ to the time $t_5$ and becomes almost zero at the time $t_5$, because the magnetic energy accumulated in the transformer 4 is small and is consumed at the output transistor 5. By selecting such a characteristic as the one of the transformer 4, it will become possible to shorten the fall time of the output transistor 5 and to reduce the loss at the normal temperature. Accordingly, it will be possible to resolve the first problem at the normal temperature.

However, in the case of the temperature of the output transistor rising due to some reason other than a rise of the horizontal deflection frequency $f_H$, such as a rise in ambient temperature, there is a high possibility that thermal runaway will occur, even if the frequency $f_H$ is low. Therefore, the second problem will be not resolved by the above method.

Figure 4:
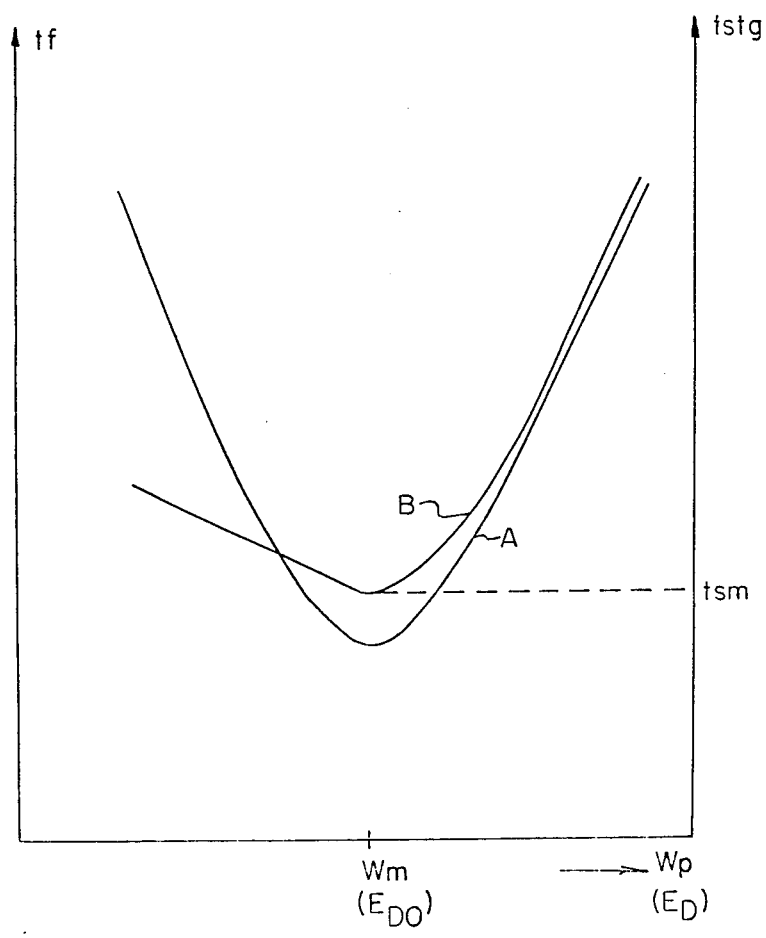
FIG. 4 shows a graph for explaining a principle of the present invention.

FIG. 4 shows a characteristic of the storage period $t_{stg}$ and the decreasing duration $t_f$ in the case where the pulse width $W_P$ of the driving pulse of the output transistor or the driving supply voltage $E_o$ is increased. A curve A indicates the fall time $t_f$ and a curve B indicates the storage period $t_{stg}$. Here, a scale for the storage period $t_{stg}$ is about one figure larger than the one for the storage period $t_f$. By increasing the pulse width $W_P$ or the driving supply voltage $E_o$, the fall time $t_f$ and the storage period $t_{stg}$ decrease and begin to increase at a pulse width $W_m$ or a driving supply voltage $E_o$, respectively. As is apparent from FIG. 4, the pulse width and the driving supply voltage for a minimum value $t_{sm}$ coincides with one for a minimum value of the fall time.

Figure 5:
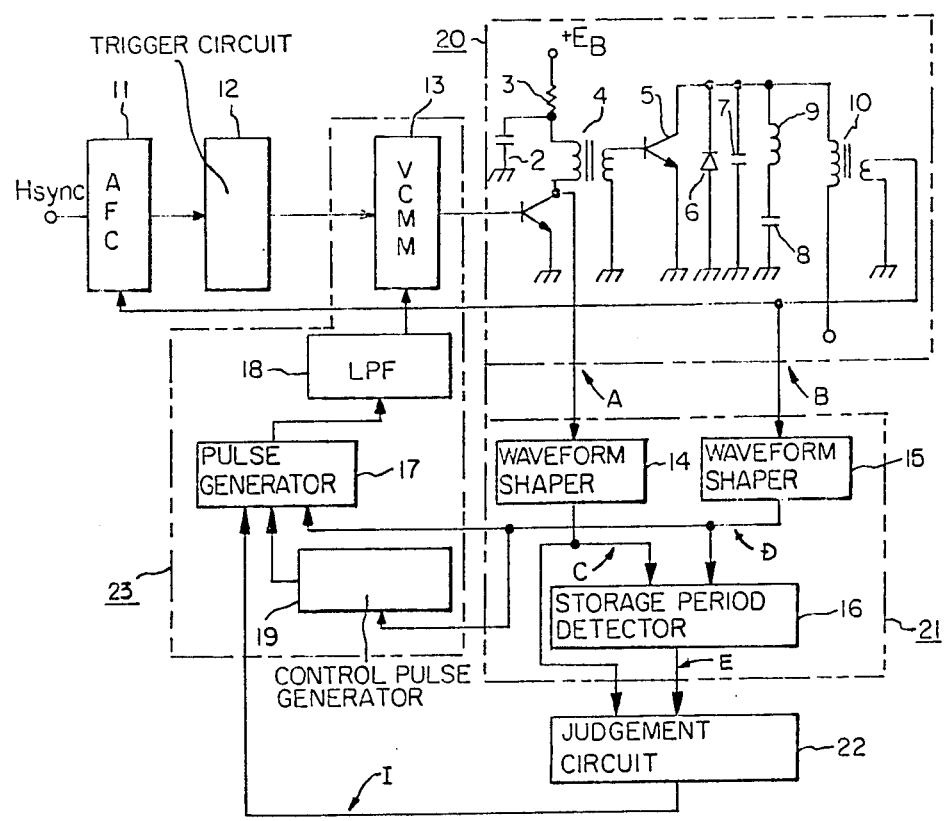
FIG. 5 illustrates a circuit diagram of an embodiment of the present invention.

Preferred embodiments of the present invention will be explained referring to the drawings. FIG. 5 shows a block diagram of the first embodiment. The blocks 13, 16, 22 and 23 shown in FIG. 5 are drawn in detail in FIGS. 6, 7, 8 and 10. Referring to FIG. 5, the numeral 20 denotes the same driving circuit as shown in FIG. 1. In this embodiment, a transistor driving circuit is constructed by the driving circuit 20, a detecting circuit 21 for detecting a storage period of the output transistor 5, a judgment circuit 22 for judging the occurrence of an increase or a decrease of the storage period detected by the detecting circuit 21, an adjusting circuit 23 for adjusting a pulse width of a pulse signal which is supplied to the base of the transistor 1 of the driving circuit 20, an AFC circuit (automatic frequency control circuit) 11, and a trigger circuit 12, for example, a voltage controlled oscillator (hereinafter, VCO). AFC circuit 11 and the trigger circuit 12 may be the same circuits as used in a conventional television or conventional display. Therefore, detailed descriptions for them are omitted. A horizontal deflection signal (H sync) is supplied to the AFC circuit 11 and an output signal of the driving circuit 20 is fed back to the AFC circuit 11 via a transformer 10.

The detecting circuit 21 comprises two waveform shapers 14 and 15 and a storage period detector 16. The waveform shaper 14 receives the collector voltage of the transistor 1, and the waveform shaper 15 receives the output signal of the driving circuit 20 via transformer 10. The storage period detector 16 detects the storage period of the output transistor 5 by detecting a difference between an output signal of waveform shaper 14 and an output signal of waveform shaper 15. The output signal of the detector 16 is provided to the judgment circuit 22.

The adjusting circuit 23 includes a control pulse generator 19, a pulse generator 17, a low pass filter (hereinafter, LPF) 18 and a voltage controlled monostable multivibrator (hereinafter, VCMM) 13. The control pulse generator 19 generates a control pulse corresponding to a pulse width being varied in a control time. The pulse generator 17 generates output pulses, a number of which correspond to an output signal of judgment circuit 22. The LPF 18 integrates the output pulses of the pulse generator 17 and supplies the VCMM 13 with a control voltage. The VCMM 13 is triggered by the output signal of the trigger circuit 12 and generates a pulse signal, the pulse width of which corresponds to the control voltage from the LPF 18.

The operation of this embodiment will be explained referring to signal waveforms shown in FIGS. 9A to 9L. The waveforms of the collector voltage of the driving transistor 1 and the output signal of the driving circuit 20 are shown in FIGS. 9A to 9B, respectively. These signals are provided to the waveform shapers 14 and 15 and become signal waveforms shown in FIGS. 9C and 9D, respectively. The storage period detector 16 compares the output signal shown in FIG. 9C with the output signal shown in FIG. 9D and generates a storage period pulse shown in FIG. 9E. The storage period pulse corresponds to the carrier storage time of the output transistor 5 as shown in FIG. 3C.

The judgment circuit 22 compares the pulse width of the storage period pulse in this control time with the pulse width of the storage period pulse in a former control time, which represents the last occurring control time; in the case of increasing pulse width, the circuit 22 outputs a high level signal "H". In the case of decreasing pulse width, it outputs a low level signal "L". FIG. 9I shows a waveform of the output signal of the judgment circuit 22, which has a high level. In the judgment circuit 22, the pulse widths are converted to voltages and the voltages are compared to each other.

The output signal of the judgment circuit 22 is supplied to the pulse generator 17. In response to the output signal of the judgment circuit 22, the pulse generator 17 generates an output signal which is made by adding or subtracting the control pulse to or from a basic pulse signal having a predetermined frequency. Namely, the pulse generator 17 holds the output signal of the judgment circuit 22 in the former time or another signal indicating whether the control pulse is added or subtracted and determines whether the control pulse should be added or subtracted in the present control time according to Table 1. Both the pulse generator 17 and the control pulse generator 19 provide the pulse signals in synchronization with the output pulse of the waveform shaper 15.

The output signal of the pulse generator 17 is integrated and converted to the control voltage by the LPF 18. The VCMM 13 receives the horizontal deflection signal processed by the AFC circuit 11 and the trigger circuit 12 and the output signal of the LPF 18. The VCMM 13 is triggered by the output signal of the trigger circuit 12, generates the output signal having the pulse width corresponding to the voltage level of the output signal of the LPF 18 from a leading edge point of the trigger signal and supplies the base of the transistor 1 with it. The VCMM 13 is constructed so that the pulse width of the output pulse becomes narrower when the output voltage of the pulse generator 17 increases and it becomes broader when the output voltage decreases.

Next, the operation of the pulse generator 17 will be explained by referring to Table 1.

TABLE 1

| The output signal of the judgment Cir. 22 | Difference Between In the former control time | Control Pulses: In the present control time | The output pulse width of the VCCM 13 |
|---|---|---|---|
| H (I) | A | A | D |
| H (I) | S | S | I |
| L (D) | A | S | I |
| L (D) | S | A | D |

A = add
S = subtract
D = decrease
I = increase

An example, in which the output signal of the judgment circuit 22 indicates "H", will be mentioned concerning Table 1.

(1) When the control pulse is added during the former control time in the pulse generator 17, the minimum value $t_{sm}$ shown in FIG. 4 exists in the direction for decreasing the pulse width $W_p$. Therefore, the control pulse is added to the basic pulse signal in the pulse generator 17, so that the pulse width of the output pulse of the VCCM 13 decreases.

(2) When the control pulse is subtracted during the former control time, the minimum value $t_{sm}$ exists in the direction for increasing the pulse width $W_p$. Therefore, the control pulse is subtracted, so that the pulse width increases.

Further, another example, in which the output signal of the judgment circuit 22 indicates "L", will be explained. In this case, the minimum value $t_{sm}$ exists in the reverse direction to an increase or a decrease of the pulse width $W_P$ in the former control time. Accordingly, an addition or a subtraction operation opposite to one executed in the former control time is done in the present control time.

In this way, the storage period $t_{tg}$ is held nearly at the minimum value $t_{sm}$, that is, a value on which the output signal of the judgment circuit 22 alternatively changes between "H" and "L".

As a result, the decreasing duration $t_f$ is constantly held on a minimum value at the same pulse width as the storage period $t_{stg}$.

Figure 6:
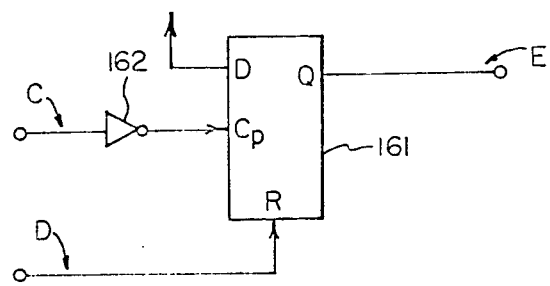
FIG. 6 shows a detailed circuit diagram of the block 16 shown in FIG. 5.

Referring to FIGS. 6 to 11, an embodiment of each circuit element will be explained. FIG. 6 shows an example of the storage period detector 16. The detector 16 includes a D-type flip-flop (hereinafter, DFF) 161 and an invertor 162 connected to a set terminal $C_p$ of the DFF 161. The inpout terminal of the inverteor 162 is connected to the output terminal of the waveform shaper 14 and supplied with the pulse shown in FIG. 9C. The rest terminal R of the DFF 161 is connected to the output terminal of the waveform shaper 15 and supplied with the pulse shown in FIG. 9D. The output signal of the DFF 161 is supplied to the judgment circuit 22. The DFF 161 is set by the trailing edge of the pulse shown in FIG. 9C, reset by the leading edge of the pulse shown in FIG. 9D and provides the output pulse indicating the storage period shown in FIG. 9E.

Figure 7:
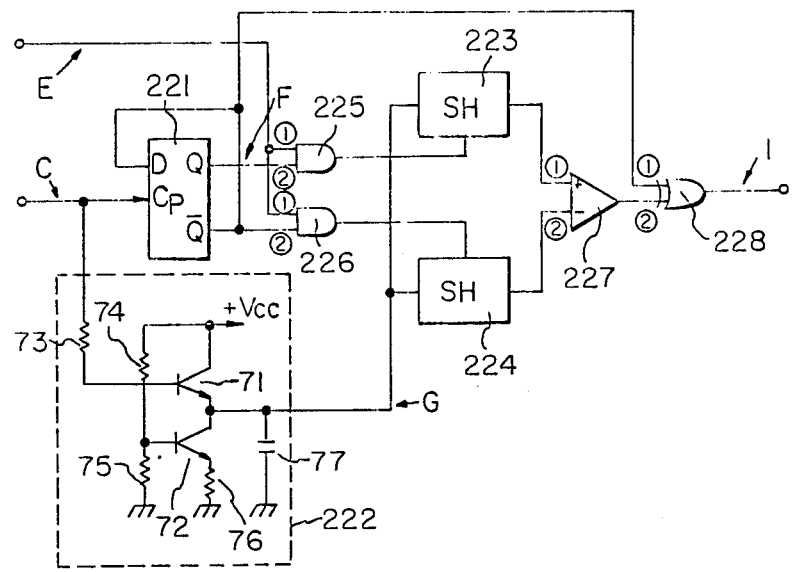
FIG. 7 shows a detailed circuit diagram of the block 22 shown in FIG. 5.

FIG. 7 shows an example of the judgment circuit 22. The judgment circuit 22 includes a DFF 221, a wave generator 222, sample hold circuits (hereinafter SH circuits) 223 and 224, AND gates 225 and 226, a comparator 227 and an exclusive OR 228. The DFF 221 operates as a divider for generating a driving pulse. The wave generator 222 generates an output signal shown in FIG. 9G by using the pulse shown in FIG. 9C from the wave shaper 14. The wave generator 222 is constructed with transistors 71 and 72, resistors 73, 74, 75 and 76 and a condenser 77.

Now, presume that "L" state periods of the driving pulse shown in FIG. 9F correspond to even periods n, and "H" state periods thereof correspond to odd periods n+1. The output signal of the AND gate 225 becomes "L" at the periods n and "H" at the periods n+1. On the other hand, the output signal of the AND gate 226 becomes "H" at the periods n and "L" at the periods n+1. The SH circuits 223 and 224 alternately receive the voltage signal shown in FIG. 9G from the wave generator 222. The SH circuit 224 holds the voltage signal $V_{stn}$ corresponding to the storage period $t_{stn}$ during the periods n, in response to the output signal of the AND gate 226. The SH circuit 223 holds the voltage signal $V_{stn+1}$ corresponding to the storage period $t_{stn+1}$ during the periods n+1, in response to the output signal of the AND gate 225. The storage periods $t_{stn}$ and $t_{stn+1}$ held in the SH circuits 223 and 224 as a voltage amplitude are compared in the comparator 227 and the exclusive OR 228 in order to decide whether the storage period should be increased or decreased.

During the even periods n, the output signal of the AND gate 225 is always "L", because the "L" state signal is supplied to the input terminal 2 of the AND gate 225, as shown in FIG. 9F. Therefore, during the periods n, the SH circuit 223 does not operate. On the contrary, during the even periods n, as a terminal $\bar{Q}$ of the DFF 221 is connected to the input terminal 2 of the AND gate 226, the "H" state signal is always supplied to the input terminal 2 of the AND gate 226. The input terminal 1 of gate 226 receives the output signal of the storage period detector 16 shown in FIG. 9E. Therefore, the AND gate 226 provides the same signal as the storage period pulse and the SH circuit 224 holds the signal shown in FIG. 9G at the trailing edge of the storage period pulse. Here, the input signal to the SH circuit 224 is a voltage of the condenser 77 in the wave generator 222. As the transistor 71 becomes an OFF state at the leading edge of the storage period and charges stored in the condenser 77 are consumed by a constant current circuit constructed by the resistors 74, 75 and 76 and the transistor 72, the voltage decreases linearly as shown in FIG. 9G. The output signal of the AND gate 226 becomes "L" at the trailing edge of the storage period pulse. Therefore, the voltage $V_{stn}$ is held by the SH circuit 224.

Next, the operation during the odd periods n+1 will be explained. The output signal Q of the DFF indicates "H" and the output signal $\bar{Q}$ is "L". Therefore, the AND gate 226 always provides an "L" level signal and the SH circuit 224 does not sample the output signal of the wave generator 222 during the odd periods n+1. On the contrary, the AND gate 225 provides the same signal as the storage period pulse. The SH circuit 223 holds the input signal shown in FIG. 9G in the same manner as the SH circuit 224 during the even periods n. A sampled voltage is the voltage $V_{stn+1}$ shown in FIG. 9G.

Further, the operations of the comparator 227 and the exclusive OR 228 will be explained. Presume that the storage period during the even periods n is longer than the storage period during the odd periods n+1, that is, $t_{stn} > t_{stn+1}$. In comparison with the input signal to the input 1 of the comparator 227, the input signal to the input 2 thereof is lower. As a result, the output signal of the comparator 227 becomes "H" as shown in FIG. 9H. As the input signal of the input 1 of the exclusive OR is an "L" level signal during the odd periods n+1, the output signal of the judgment circuit 22 becomes "H".

When the storage period on one of the periods is shorter than one on the former period and the even periods n are replaced with the odd periods n+1, the output signal of the comparator 227 becomes "L", but the output signal of the judgment circuit 22 becomes "H" as shown in FIG. 9I because the input signal to the input 1 of the exclusive OR 228 is "H". Namely, when the storage period of the following period is shorter than one of the former period, the output signal of the judgment circuit 22 becomes "H" from the trailing edge of the storage period to a point, at which the output Q reverses the polarity. In contrast, when the storage period of the following period is longer than the former one, with the same algorithm as explained above, the output signal of the judgment circuit 22 becomes "L" during the same period.

Figure 8:
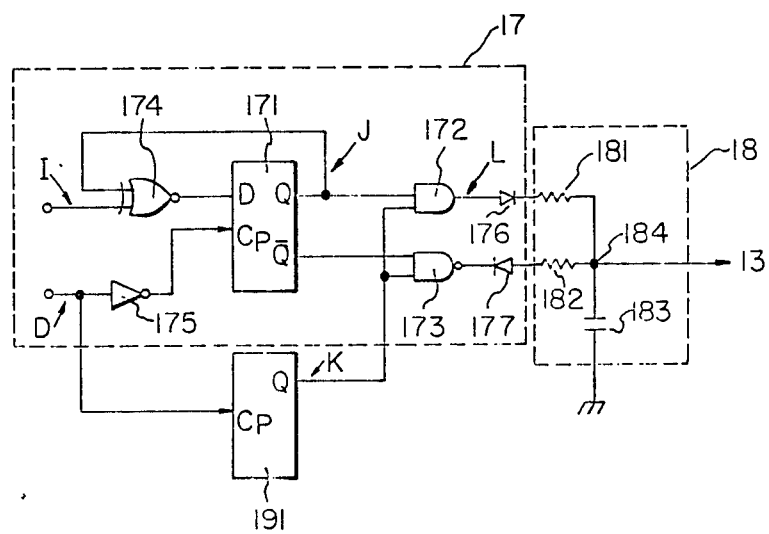
FIG. 8 shows a detailed circuit diagram of the blocks 17, 18 and 19 shown in FIG. 5.

Next, an example of the adjusting circuit 23 will be explained referring to FIG. 8. The pulse generator 17 comprises a DFF 171, an AND gate 172, a NAND gate 173, a coincidence circuit 174, a NOT gate 175 and diodes 176 and 177. The LPF18 is constructed by resistors 181 and 192 and a condenser 183. The control pulse generator 19 is formed by a monostable multivibrator (hereinafter MM). The DFF 171 memorizes information concerning add or subtract of the control pulse in the former control time.

Now, consider the case when the pulse width decreases after adding the control pulse in the period n and the judgment circuit 22 decides that $t_{stn} > t_{stn+1}$ in the period n+1. As the storage period $t_{stn}$ is longer than the storage period $t_{stn+1}$, the input pulse of the coincidence circuit 174 becomes "H". In this case, the output Q of the DFF 171 is "H" as shown in FIG. 9J, because the control pulse increases in the period n. Therefore, the input D of the DFF 171 is supplied with an "H" level signal. The terminal Cp of the DFF 171 receives an inverted pulse from the NOT gate 175. The DFF 171 holds the input signal to the input D at the trailing edge, that is, "H". The AND gate 172 receives the output signal from the output Q of the DFF 171 and the output signal of the MM 191. Therefore, the output signal of the AND gate 172 becomes "H" in the period that the control pulse shown in FIG. 9K is "H". As a result, the diode 176 has a "pass" state during the period in which the control pulse is "H", and charges corresponding to the pulse width of the control pulse are stored in the condenser 183. That is, charges corresponding to one of the control pulses increases and the potential of an output terminal 184 rises.

Next, consider the case when the pulse width decreases after adding the control pulse in the period n, but the judgment circuit 22 decides that $t_{stn} > t_{stn+1}$. As the storage period $t_{stn}$ is shorter than the storage period $t_{stn+1}$, the input pulse of the coincidence circuit 174 becomes "L". In this case, the output Q of the DFF 171 is "H", because the control pulse increases in the period n. Therefore, the output signal of the coincidence circuit 174 becomes "L", and the DFF 171 holds "L" during the period n+1. As the input of the AND gate 172 always receives an "L" level signal from the output Q of the DFF 171, the AND gate 172 provides an "L" level signal. On the contrary, the output Q of the DFF 171 rises to "H" level and the output of the NAND gate 173 provides a "L" level signal during a period in which the control pulse from the MM 191 is "H" level. During the same period, the diode 177 has a "pass" state and the charges corresponding to the pulse width of the control pulse are discharged from the condenser 183. That is, the charges corresponding to one control pulse decrease and the potential of the output terminal 184 goes down.

Further, during the periods n, in the case where the output signal of the output Q of the DFF 171 is "L" level, if the output signal of the judgment circuit 22 is "H", the charge is discharged from the condenser 183, and if the output signal of the judgment circuit 22 is "L", the charge is stored in the condenser 183. Namely, in the case where the output signal of the judgment circuit 22 does not vary, the output signal of the output Q of the DFF 171. In the case where the output signal of the judgment circuit 22 varies, the output signal of the output Q changes to a reverse state in comparison with the former state.

Figure 10:
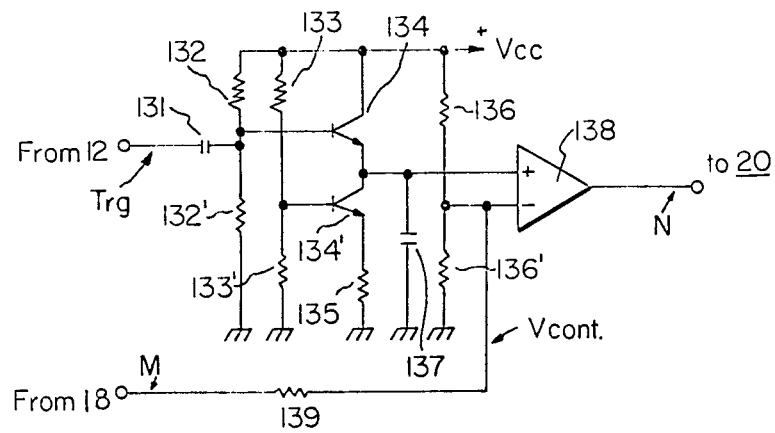
FIG. 10 shows a circuit diagram of a voltage controlled monostable multivibrator used in FIG. 5.
Figure 11:
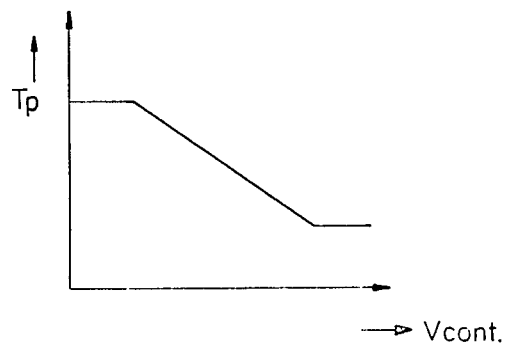
FIG. 11 illustrates an output characteristic of the circuit shown in FIG. 10.

Finally, VCMM 13 varies the pulse width in response to the output signal of the LPF 18. FIG. 10 shows one example of the VCMM 13. A transistor 134 is triggered one time per each horizontal period by an output signal of the trigger circuit 12. The trigger signal is differentiated by a condenser 13 and resistors 132 and 132'. The transistor 134 changes to a "pass" state at the leading edge of the trigger signal, so that a condenser 137 is instantaneously charged to $V_{cc}$. After that, a constant current circuit constructed by a transistor 134' and resistors 133, 133' and 135 discharges condenser 137 and the terminal voltage of the condenser 137 decreases linearly. An output signal of a comparator 138 becomes "H" level at the leading edge of the trigger signal and becomes "L" level at a time in which a voltage of an input 1 of the comparator 138 becomes lower than a voltage (V cont.) of another input 3 thereof. The voltage (V cont.) of the input 2 is a divided voltage of the output signal of the LPF 23 bt.) of another input 3 thereof. The voltage (V cont.) of the input 2 is a divided voltage of the output signal of the LPF 23 by resistors 136, 136' and 139. As a result, the VCMM 13 has the characteristic shown in FIG. 11. Referring to FIG. 11, a two-coordinate graph, an abscissa axis indicates the voltage (V cont.) and an ordinate axis indicates the pulse width ($T_P$) of the output pulse.

Figure 12:
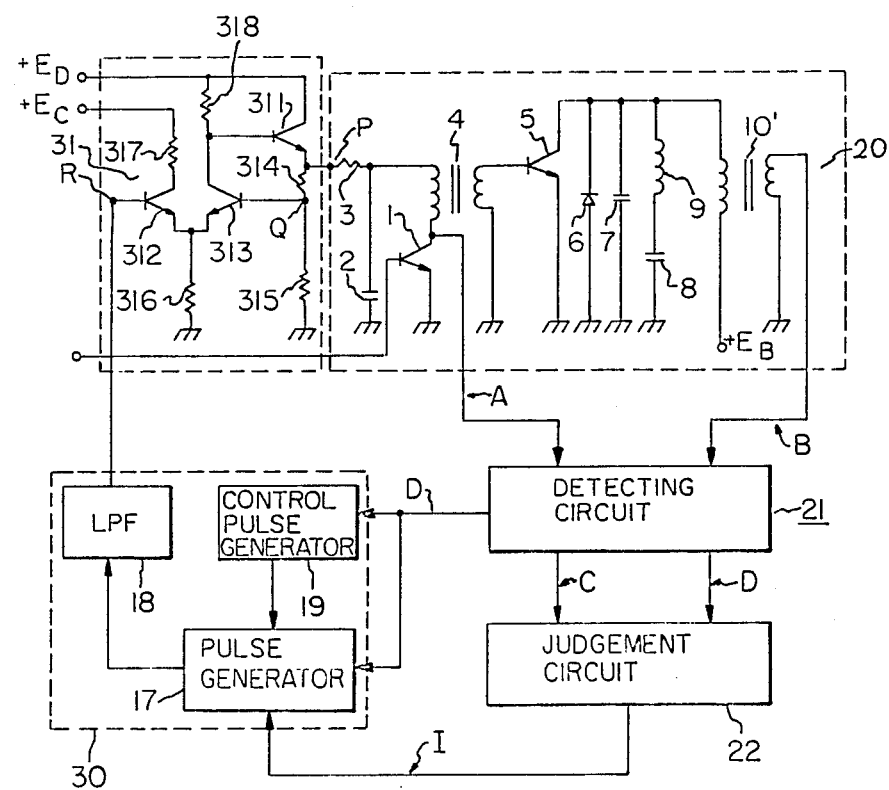
FIG. 12 shows a circuit diagram of another embodiment of the present invention.

FIG. 12 illustrates a circuit diagram of another embodiment of the present invention. In this embodiment, the drive supply voltage $E_d$ is controlled for keeping the storage period $t_{stg}$ at the minimum value $t_{sm}$. Referring to FIG. 12, several of the same circuit elements as shown in FIG. 5, for example, the detecting circuit 21 and the judgment circuit 22, are used. The numeral 31 denotes a drive voltage control circuit. The drive voltage control circuit 31 includes a control transistor 311, amplifying transistors 312 and 313, dividing resistors 314 and 315, load resistors 317 and 318 and an emitter resistor 316. The control transistor 311 adjusts a voltage of an input terminal P of the driving circuit 20 corresponding to a control voltage, which is an output signal of a control voltage generator 30. The control voltage generator 30 is constructed with the pulse generator 17, the control pulse generator 19 and the LPF 18 as shown in FIG. 5. Therefore, the output signal of the control voltage generator 30 is the same signal as the output signal of the LPF 18 shown, in FIG. 5. The drive voltage control circuit 31 determines the voltage of the input terminal P, a voltage at a point Q, (which is a divided voltage of the voltage of the input terminal P), becomes equal to a voltage at a point R, that is, equal to the output signal of the LPF 18. As a result, the driving supply voltage is controlled in response to the output signal of the LPF. In FIG. 12, $E_D'$ and $E_C$ are direct current supplies. It is no problem that $E_C$ is equal to $E_D'$.

The operation of the other elements 17–19, 21 and 22 of the circuit shown in FIG. 12 is the same as that shown in FIG. 5. Therefore, a detailed explanation thereof need not be repeated.

In the above embodiments, the polarities of the pulse signal, the sampling signal and the output signals will not be restricted to the ones described hereinbefore. Further, for the convenience of explanation, the time constant of the LPF 18 has been set to be adequately smaller than the horizontal period, and the stable state of the present drive circuit has been mentioned as the state where the condenser 183 of the LPF 18 alternately charges and discharges. However, by selecting the time constant of the LPF at such a value that is adequately longer than the horizontal period, there is no non-stability of the circuit by a repetition of charge and discharge.

Therefore, it is possible to hold the fall time at the minimum value by detecting the storage period $t_{stg}$ and controlling one of the signals supplied to the primary coil to keep the storage period $t_{stg}$ at the minimum value $t_{sm}$. As a result, in this invention, it becomes possible to suppress a generation of energy losses during the fall time and prevent thermal runaways.

According to the driving circuit of the present invention, it becomes possible to continuously maintain the fall time of the output transistor at its minimum value, even if the ambient temperature increases, and provide a high speed switching circuit without thermal runaway.

We claim:

1. A driving circuit including an output transistor having a storage period characterized by a value and providing an output signal exhibiting a waveform, and a driving transformer with a primary coil supplied with a pulse signal having a pulse width and a drive voltage signal having an amplitude and a secondary coil connected to a base of the output transistor driven in response to the pulse signal, comprising:
    means for detecting the value of the storage period of the output transistor, and
    means connectable to said detecting means, for controlling one of the signals supplied to the primary coil in response to the detected value of the storage period detected by said detecting means to minimize the storage period.

2. A driving circuit according to claim 1, wherein said controlling means comprises:
    means for judging a sign of any change between the detected value of the storage period in a present control time and the detected value of the storage period in a former control time, said judging means providing an output signal indicative of the sign;
    means for generating a present control signal in response to said output signal from said judging means; and
    means for varying a characteristic of the signal supplied to the primary coil in response to said present control signal.

3. A driving circuit according to claim 2, wherein said judging means comprises:
    means for holding the detected values of the storage periods in said present control time and in said former control time, and
    means for comparing the detected value of the storage period in said present control time held in said holding means with the detected value of the storage period in said former control time held in said holding means.

4. A driving circuit according to claim 3, wherein said holding means comprises:
a first sample hold circuit for holding the detected value of the storage period in said present control time, and
a second sample hold circuit for holding the detected value of the storage period in said former control time.

5. A driving circuit according to claim 2, wherein said generating means comprises:
means for holding information corresponding to a former control signal in said former control time, and
means for making said present control signal in response to said output signal from said judging means and said information held by said holding means and corresponding to the former control signal.

6. A driving circuit according to claim 2 wherein:
said varying means controls the pulse width of the pulse signal in response to said present control signal.

7. A driving circuit according to claim 2, wherein:
said varying means controls the amplitude of the drive voltage signal in response to said present control signal.

8. A driving circuit according to claim 1, wherein said detecting means comprises:
first means for shaping a waveform of the voltage at one terminal of said primary coil,
second means for shaping the waveform of the output signal of said output transistor, and
means for detecting a time interval between a trailing edge of the output signal of said first shaping means and a leading edge of the output signal of said second shaping means.

9. A driving circuit, comprising:
a driving transformer having a primary coil and a secondary coil,
a driving switch connected serially to one terminal of said primary coil for supplying said primary coil with a pulse signal having a pulse width,
means for storing energy, connected to said primary coil,
means for supplying said primary coil with a driving voltage signal having an amplitude,
an output transistor having a storage period and including a base connected to said secondary coil,
means for detecting the value of the storage period of said output transistor, and
means for controlling one of the signals supplied to said primary coil to maintain the value of said storage period at a minimum value.

10. A driving circuit according to claim 9, wherein said controlling means comprises:
means for judging a sign of any change between the value of the storage period in a present control time and the value of the storage period in a former control time detected by said detecting means, said judging means providing an output signal indicative of the sign,
means for generating a present control signal in response to said output signal from said judging means, and
means for varying a characteristic of the signal supplied to the primary coil in response to said present control signal.

11. A driving circuit according to claim 10, wherein said judging means comprises:
means for holding the detected values of the storage periods in said present control time and in said former control time, and
means for comparing the detected value of the storage period in said present control time held in said holding means with the detected value of the storage period in said former control time held in said holding means.

12. A driving circuit according to claim 9, wherein said driving switch includes a semiconductor device.

13. A driving circuit according to claim 12, wherein said semiconductor device includes a transistor having a collector connected to said one terminal of said primary coil.

14. A driving circuit according to claim 13, wherein said detecting means comprises:
first means for shaping a waveform of the collector voltage of said transistor,
second means for shaping a waveform of the output signal of said output transistor, and
means for detecting a time interval between a trailing edge of the output signal of said first shaping means and a leading edge of the output signal of said second shaping means.

15. A driving circuit according to claim 10, wherein said generating means comprises:
means for holding information corresponding to a former control signal in said former control time, and
means for making said present control signal in response to said output signal from said judging means and said information.

16. A driving circuit according to claim 9, wherein said controlling means controls the pulse width of said pulse signal 17. A driving circuit according to claim 9, wherein said controlling means controls the amplitude of the driving voltage signal.

18. A driving circuit, comprising:
energy storage means with one end being alternatively connected to a reference potential level,
a driving transformer having a primary coil and a secondary coil, one terminal of said primary coil being connected to the other end of said energy storage means,
a driving semiconductor device with a first electrode connected serially to another terminal of said primary coil for supplying said primary coil with a pulse signal,
means connected to said one terminal of said primary coil for supplying said primary coil with a driving voltage signal;
an output semiconductor device having a first electrode connected to said secondary coil for providing an output signal,
first means for shaping the waveform of a current through said first electrode of said driving semiconductor device,
second means for shaping the waveform of said output signal of said output semiconductor device,
means for detecting a time interval between the waveform output from said first shaping means and the waveform output from said second shaping means for storing said time intervals corresponding to a present control time and corresponding to a former control time, means for comparing said time interval of said present control time with said time interval of said former control time, said comparing means providing an output pulse indicative of the sign of any change between said time interval in said present control time and said time interval in said former control time, means for holding information about a control signal, means for generating a present control signal in response to said output pulse from said comparing means and information corresponding to the control signal generated during said former control time, and means for varying a characteristic of one of the signals supplied to said primary coil in response to said present control signal.

19. A method for controlling a driving circuit comprising a driving transformer having a primary coil and a secondary coil, a driving transistor connected serially to the primary coil for providing a pulse signal having a pulse width to the primary coil, an output transistor having a storage period and including a base connected to the secondary coil for providing an output signal and means for supplying a driving voltage signal having an amplitude to the primary coil, comprising the steps of:

detecting the value of the storage period of the output transistor, and controlling one of the signals supplied to the primary coil in response to the detected value of the storage period detected to minimize said storage period.

20. A method according to claim 19, wherein said detecting step includes a step of detecting a time interval between a trailing edge of the pulse signal and a leading edge of the output signal from the output transistor.

21. A method according to claim 19, wherein said controlling step includes a step of controlling the pulse width of the pulse signal in response to the detected value of the storage period.

22. A method according to claim 19, wherein said controlling step includes a step of controlling the amplitude of the driving voltage signal in response to the detected value of the storage period.

23. A method according to claim 19, wherein said detecting step comprises:

shaping a waveform of voltage at a collector of said driving transistor to provide a first shaped waveform;

shaping the waveform of an output signal of said output transistor to provide a second shaped waveform;

detecting a time interval between a trailing edge of said first shaped wave form and a leading edge of said second shaped waveform.

24. A method according to claim 19, wherein said controlling step comprises:

providing a present control signal indicative of a sign of any change between the detected value of the storage period during a present control time and the detected value of the storage period during a former control time;

varying a characteristic of the control signal supplied to the primary coil in response to said present control signal.

25. A driving circuit including an output transistor having a storage period and providing an output signal exhibiting a waveform, and a driving transformer with a primary coil supplied with a pulse signal having a pulse width and a drive voltage signal having an amplitude, and a secondary coil connected to a base of the output transistor and driven in response to the pulse signal, comprising:

means for detecting a value of the storage period of the output transistor;

first means for holding the value of the storage period during a present control time detected by said detecting means;

second means for holding the value of the storage period during a former control time detected by said detecting means;

means providing a present control signal indicative of a sign of any change between the value of the storage period detected during a present control time held by said first holding means and the value of a storage period detected during a former control time held by said second holding means;

means for varying a characteristic of one of the signals supplied to the primary coil in response to said present ontrol signal, to minimize the storage period.

26. A driving circuit according to claim 25, wherein said detecting means comprises:

first means for shaping the wave form of the voltage at one terminal of said primary coil;

second means for shaping the waveform of the output signal of said output transistor; and means for detecting a time interval between a trailing edge of the output signal of said first shaping means and a leading edge of the output signal of said second shaping means.

27. A driving circuit according to claim 25, wherein said varying means controls the pulse width of the pulse signal in response to said present control signal.

28. A driving circuit according to claim 25, wherein said varying means controls the amplitude of the drive voltage signal in response to said present control signal.

29. A driving according to claim 26, wherein said varying means controls the pulse width of the pulse signal in response to said present control signal.

30. A driving circuit according to claim 26, wherein said varying means controls the amplitude of the drive voltage signal in response to said present control signal.

31. A driving circuit including an output transistor having a storage period and providing an output signal having a waveform, and a driving transformer with a primary coil supplied with a pulse signal having a pulse width and a drive voltage signal having an amplitude and waveform, and a secondary coil connected to a base of the output transistor driven in response to the pulse signal, comprising:

first means for shaping a waveform of the voltage at one terminal of said primary coil;

second means for shaping the waveform of the output signal of said output transistor;

means for detecting a time interval between a trailing edge of the output signal of said first shaping means and a leading edge of the output signal of said second shaping means; and means for controlling one of the signals supplied to the primary coil in response to the time interval-detected by said detecting means, to minimize the storage period of the output transistor.

32. A driving circuit according to claim 31, wherein said controlling means comprises:
   means for providing a present control signal indicative of a sign of any change between the value of the time interval detected during a present control time and the value of the time interval detected during a former control time; and
   means for varying a characteristic of the signal supplied to the primary coil in response to said present control signal.

33. A driving circuit according to claim 32, wherein said varying means controls the pulse width of the pulse signal in response to said present control signal.

34. A driving circuit according to claim 32, wherein said varying means controls the amplitude of the drive voltage signal in response to said present control signal.

35. A driving circuit according to claim 32, wherein said providing means comprises:
   means for holding the values of the time intervals detected during said present control time and said former control time; and
   means for comparing the value of the time interval during said present control time held by said holding means with the value of the time interval during said former control time held by said holding means.

36. A driving control circuit according to claim 35, wherein said holding means comprises:
   first means for holding the value of the time interval detected during said present control time; and
   second means for holding the value of the time interval detected during said former control time.

37. A driving circuit, comprising:
   a driving transformer having a primary coil and a secondary coil;
   a driving switch connected to one terminal of said primary coil for supplying said primary coil with a pulse signal;
   means for supplying energy to said primary coil;
   means for supplying said primary coil with a driving voltage signal;
   an output transistor having a base connected to said secondary coil;
   means for detecting the value of the storage period of said output transistor;
   means for providing a present control signal indicative of the sign of any change between the value of the storage period detected during a present control time and the value of the storage period detected during a former control time; and
   means for varying in response to said present control signal, a characteristic of one of the signals supplied to said primary coil, to thereby minimize the value of said storage period.

38. A driving circuit according to claim 37, wherein said detecting means comprises:
   first means for shaping the waveform of the voltage at said one terminal of said primary coil;
   second means for shaping the waveform of the output signal of said output transistor; and
   means for detecting a time interval between a trailing edge of an output signal provided by said first shaping means and a leading edge of an output signal provided by said second shaping means.

39. A driving circuit according to claim 37, wherein said providing means comprises:
   means for holding the detected values of the storage periods in said present control time and in said former control time; and
   means for comparing the detected values held by said holding means.

40. A driving circuit including an output transistor having a storage period characterized by a value, and a driving transformer with a primary coil supplied with a pulse signal exhibiting a pulse width and a drive voltage signal exhibiting an amplitude and a secondary coil connected to the base of the output transistor and driven in response to the pulse signal, comprising:
   means for detecting the value of the storage period of the output transistor; and
   controlling means for determining a sign of any change between the value of the storage period detected during an earlier control time and the value of the storage period detected during a current control time by said detecting means and for minimizing on the basis of the sign, the value of the storage period by varying a characteristic of one of the signals supplied to the primary coil.

41. A driving circuit according to claim 40, wherein said detecting means comprises:
   first means for shaping the waveform of the voltage at one terminal of said primary coil;
   second means for shaping the waveform of the output signal of said output transistor; and
   means for detecting a time interval between a trailing edge of the output signal of said first shaping means and a leading edge of the output signal of said second shaping means.

42. A driving circuit according to claim 40, wherein said controlling means varies the pulse width of the pulse signal to minimize the storage period.

43. A driving circuit according to claim 40, wherein said controlling means varies the amplitude of the drive voltage signal to minimize the storage period.

44. A driving circuit according to claim 41, wherein said controlling means varies the pulse width of the pulse signal to minimize the storage period.

45. A driving circuit according to claim 41, wherein said controlling means varies the amplitude of the drive voltage signal to minimize the storage period.

46. A driving circuit according to claim 41, wherein said controlling means comprises:
   means for holding the values of a time interval detected during said earlier control time and a time interval detected during said current control time; and
   means for comparing the detected values held by said holding means.

47. A driving control circuit according to claim 46, wherein said holding means comprises:
   first means for holding the value of the time interval detected during said current control time; and
   second means for holding the value of the time interval detected during said earlier control time.

48. A driving circuit, comprising:
   a driving transformer having a primary coil and a secondary coil;
   a driving switch connected serially to one terminal of said primary coil for supplying said primary coil with pulse signal;
   means for storing energy, connected to said primary coil;

means for supplying said primary coil with a driving voltage signal;

an output transistor having a storage period characterized by a value and providing an output signal exhibiting a waveform, and including a base connected to said secondary coil;

means for detecting the value of the storage period of said output transistor; and controlling means for responding to a sign of any change between the value of the storage period detected during an earlier control time and the value of the storage period detected during a current control time by said detecting means, and for minimizing the storage period by controlling a characteristic of one of the signals supplied to the primary coil on the basis of the sign.

49. A driving circuit according to claim 48, wherein said detecting means comprises:

first means for shaping a waveform of the voltage at one terminal of said primary coil;

second means for shaping the waveform of the output signal of said output transistor; and means for detecting a time interval between a trailing edge of a waveform provided by said first shaping means and a leading edge of a waveform provided by a second shaping means.

50. A driving circuit according to claim 48, wherein said controlling means comprises:

means for holding the detected values of a storage period in said current control time and a storage period in said earlier control time; and means for comparing the values held by said holding means.

* * * * *